(12) United States Patent
Dounas et al.

(10) Patent No.: US 8,809,109 B2
(45) Date of Patent: Aug. 19, 2014

(54) METHOD AND STRUCTURE FOR ELIMINATING EDGE PEELING IN THIN-FILM PHOTOVOLTAIC ABSORBER MATERIALS

(75) Inventors: Laila Dounas, San Jose, CA (US); Robert D. Wieting, Simi Valley, CA (US); Chester A. Farris, III, Yorba Linda, CA (US)

(73) Assignee: Stion Corporation, San Jose, CA (US)

( * ) Notice: Subject to any disclaimer, the term of this patent is extended or adjusted under 35 U.S.C. 154(b) by 107 days.

(21) Appl. No.: 13/476,594

(22) Filed: May 21, 2012

(65) Prior Publication Data

US 2013/0306150 A1    Nov. 21, 2013

(51) Int. Cl.
*H01L 31/0248* (2006.01)

(52) U.S. Cl.
USPC .................. 438/95; 438/98; 438/80; 438/68

(58) Field of Classification Search
CPC .................................................. H01L 31/0248
USPC ........................................ 438/98, 80, 95, 68
See application file for complete search history.

(56) References Cited

U.S. PATENT DOCUMENTS

| | | | |
|---|---|---|---|
| 5,626,688 A * | 5/1997 | Probst et al. ................... | 136/265 |
| 2008/0283389 A1* | 11/2008 | Aoki ......................... | 204/192.15 |
| 2010/0139769 A1* | 6/2010 | Mapel ........................... | 136/259 |
| 2010/0243030 A1* | 9/2010 | Yago ............................. | 136/244 |
| 2011/0073983 A1* | 3/2011 | Tanida et al. .................. | 257/466 |
| 2011/0226336 A1* | 9/2011 | Gerbi et al. ..................... | 136/262 |
| 2012/0073645 A1* | 3/2012 | Sung ............................. | 136/256 |
| 2012/0273039 A1* | 11/2012 | Pak ............................... | 136/256 |

FOREIGN PATENT DOCUMENTS

EP         2306524 A2 *  4/2011

* cited by examiner

*Primary Examiner* — Jarrett Stark
*Assistant Examiner* — Mohammad M Hoque
(74) *Attorney, Agent, or Firm* — Kilpatrick Townsend & Stockton LLP (57) ABSTRACT

A method for manufacturing a thin-film photovoltaic device includes providing a glass substrate contained sodium species. The glass substrate comprising a surface region and a peripheral edge region surround the surface region. The method further includes forming a barrier material overlying the surface region and partially overlying the peripheral edge region and forming a conductor material overlying the barrier material. Additionally, the method includes forming at least a first trench in a vicinity of the peripheral edge region to remove substantially the conductor material therein and forming precursor materials overlying the patterned conductor material. Furthermore, the method includes thermally treating the precursor materials to transform the precursor materials into a film of photovoltaic absorber. The first trench is configured to maintain the film of photovoltaic absorber substantially free from peeling off the conductor material.

13 Claims, 8 Drawing Sheets

METHOD AND STRUCTURE FOR ELIMINATING EDGE PEELING IN THIN-FILM PHOTOVOLTAIC ABSORBER MATERIALS

BACKGROUND OF THE INVENTION

The present invention relates generally to techniques for the manufacture of photovoltaic devices. More particularly, the present invention provides a method and structure for eliminating peeling of a photovoltaic absorber film from the lower conductive material. Merely by way of examples, the present method is implemented within a routine patterning process for the manufacture of thin-film photovoltaic modules to prevent peeling caused by impurity from edge region of the substrate, but it would be recognized that the invention may have other applications.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in Calif. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies for thin-film photovoltaic cells based on various types of absorber materials are often relatively poor. Recently, many improvements in thin-film material processing have been achieved in the manufacture of high efficiency monolithic integrated thin-film solar modules on large glass substrates. For example, sodium doping is found to enhance the IV characteristics of the copper-indium-selenium based photovoltaic cells. While un-controlled sodium species in the thin-film photovoltaic cells are also found to cause degradation of the films. In particular, excessive sodium species may cause the thin-film absorber being peeled off from the conductive material that serves as bottom electrode, especially from one or more edge regions. These and other limitations of these conventional thin-film solar module manufacture techniques can be found throughout the present specification and can be improved by applying one or more embodiments of present invention described in the specification below.

BRIEF SUMMARY OF THE INVENTION

The present invention relates generally to techniques for the manufacture of photovoltaic devices. More particularly, the present invention provides a method and structure for eliminating peeling of a photovoltaic absorber film from the lower conductive material. Merely by way of examples, the method includes patterning a conductive film to form a trench structure to isolate peripheral edge region for ensuring the thin-film photovoltaic absorber on main surface region substantially free from peeling off caused by impurity from the edge region, but it would be recognized that the invention may have other applications.

In a specific embodiment, the present invention provides a method for manufacturing a thin-film photovoltaic device free of film peeling problem. The method includes providing a soda lime glass substrate containing sodium species and having a surface region and a peripheral edge region surround the surface region. The method further includes forming a barrier material overlying the surface region and partially overlying the peripheral edge region. Additionally, the method includes forming a conductor material overlying the barrier material and patterning the conductor material to form a plurality of trenches in the conductor material including a first trench formed in vicinities of the peripheral edge region with the conductor material therein substantially removed. Furthermore, the method includes forming two or more thicknesses of precursor materials overlying the patterned conductor material. Moreover, the method includes treating the one or more thicknesses of precursor materials at temperatures above 400° C. in an environment containing reactive gaseous species to induce a transformation of the one or more thicknesses of precursor materials into a film of photovoltaic absorber. The first trench is configured to surround the surface region for substantially preventing the film of photovoltaic absorber on the surface region from peeling off the conductor material.

In another specific embodiment, the invention provides a film structure for manufacturing a photovoltaic device free of peeling effect. The structure includes a glass substrate having a surface region and a bulk region. The bulk region contains sodium species. The surface region is surrounded by a peripheral edge region. The structure also includes a barrier material overlying the surface region and partially overlying the peripheral edge region, and a conductor material overlying the barrier material and partially overlying the peripheral edge region. Additionally, the structure includes a first trench with the substantially all the conductor material therein being removed. The first trench is at least formed a closed loop in a vicinity of the peripheral edge region surrounding the surface region. Further, the structure includes one or more thicknesses of precursor materials overlying the conductor material and at least partially filling the first trench. The one or more thicknesses of precursor materials are subjected to an environment of reactive Selenium gaseous species at temperatures above 400° C. and transformed into a film of photovoltaic absorber. The film of photovoltaic absorber is characterized by substantially free from peeling off the conductor material anywhere within the surface region surrounded by the first trench.

Many benefits can be achieved by applying the embodiments of the present invention. The present invention provides a method for eliminating a thin-film peeling-off problem occurred especially in edge regions during the manufacture of thin-film solar modules. Certain embodiments of the invention are implemented for enhancing photovoltaic efficiency by selecting a soda lime glass substrate containing a trace of sodium species. The soda lime glass substrate with rounded peripheral edge region is selected based on its overall mechanical strength and other properties. Some embodiments are implemented to use a barrier material for blocking un-controlled sodium species from diffusing into thin films formed for the manufacture of the thin-film solar modules, though a small portion of sodium species may pass into a conductor (Mo) film at the rounded edge region where imperfections occur at the transition from the glass surface to the ground rounded surface. Such imperfections may lead to poor coverage by the barrier film allowing direct contact of conductor film to glass in a vicinity of the rounded peripheral edge region. Other embodiment includes utilizing one or laser patterning processes in a conductor material overlying the barrier material to form a trench in the vicinity around the peripheral edge region to remove the conductor material therein. The trench provides a physical restriction to the un-wanted sodium species and prevents them entering the conductor material along their interface in the major surface region. Thus, during high-temperature treatment of the thin films formed in subsequent processes, the possible film peeling-off problem, likely caused by excessive sodium species, is restricted to the edge region outside the trench. These and other benefits may be described throughout the present specification and more particularly below.

DETAILED DESCRIPTION OF THE INVENTION

The present invention relates generally to techniques for the manufacture of photovoltaic devices. More particularly, the present invention provides a method and structure for eliminating peeling of a photovoltaic absorber film from the lower conductive material. Merely by way of examples, the present method includes patterning a conductive film to form a trench structure to isolate peripheral edge region for ensuring the thin-film photovoltaic absorber on main surface region substantially free from peeling off due to impurity from the edge region of the substrate, but it would be recognized that the invention may have other applications.

Out of various forms, flat glass panels have been widely used as substrates for the manufacture of thin-film photovoltaic modules. A rectangular shaped window glass often is a choice for making monolithic thin-film solar module for being installed on a building roof or being assembled into a solar-energy production system in large-scale field deployment. A typical option of the window glass is a soda lime glass made by float glass techniques. The float glass may be provided as a type with a sharp square edge or another type with an edge rounded by a grinding process. In one or more embodiments, the latter type is found to be higher in overall mechanical yield with less chance of occurrence in broken parts and edge chips clamshell or loss due to other mechanical scraps. In one or more additional embodiments, sodium species naturally contained in the soda lime glass substrate are found to be an important material ingredient that may positively or negatively affect the thin-film photovoltaic devices formed on the substrate. For example, sodium species as a dopant is found to help causing a larger grain size of copper-indium selenide based thin-film photovoltaic absorber that contributes an enhanced energy conversion efficiency of the solar module. In another example, the sodium species from the soda lime glass substrate are also found, if without control, to cause poor device performance and other side-effect quality issues. More details about doping sodium into the thin-film photovoltaic absorber and controlling sodium from the soda lime glass substrate to make advanced thin-film solar module can be found in U.S. Patent Application No. 61/523, 802, filed on Aug. 15, 2011, commonly assigned to Stion Corporation of San Jose, Calif. and incorporated as a reference for all purposes. Further, embodiments of the present invention, as described throughout the specification and particularly below, provide techniques for manufacturing thin-film photovoltaic devices substantially without some side-effects caused by the sodium species in the soda lime glass substrates.

Figure 1:
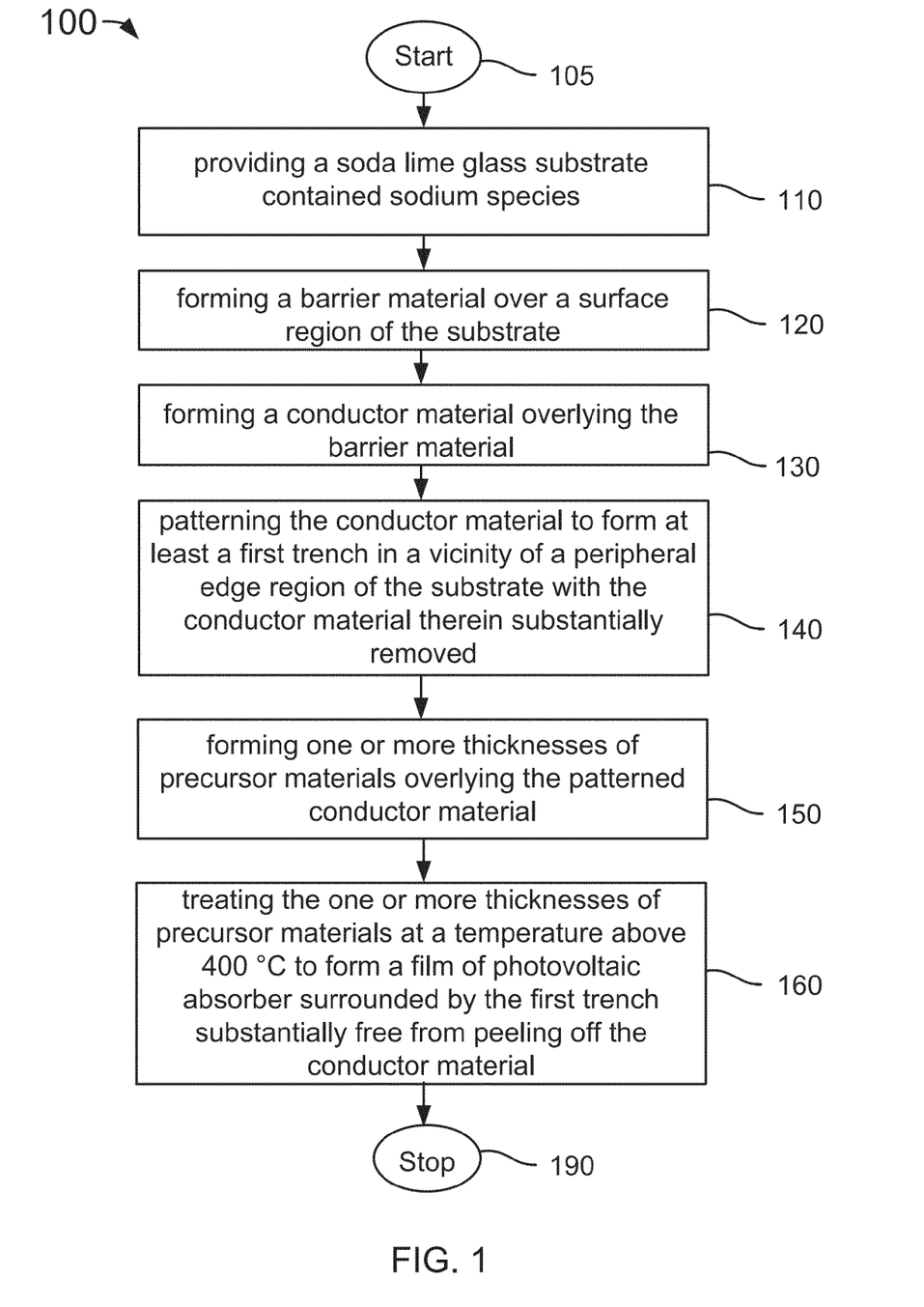
FIG. 1 is a flowchart illustrating a method for manufacturing thin-film photovoltaic devices free of film peeling according to an embodiment of the present invention.

FIG. 1 is a flowchart illustrating a method for manufacturing thin-film photovoltaic devices free of film peeling from edges according to an embodiment of the present invention. This diagram is merely an example, which should not unduly limit the scope of the claims herein. As shown, the method 100 includes, at least partially, a series of steps or processes for forming a thin-film photovoltaic device monolithically integrated on a substrate substantially free of film edge-peeling problem. In a specific embodiment, the series of steps are summarized as following:

1. Start;
2. Providing a soda lime glass substrate contained a trace of amount of sodium species;
3. Forming a barrier material over a surface region of the soda lime glass substrate;
4. Forming a conductor material overlying the barrier material;
5. Patterning the conductor material to form at least a first trench in a vicinity of a peripheral edge region of the substrate with the conductor material therein substantially removed;
6. Forming one or more thicknesses of precursor materials overlying the patterned conductor material;

7. Treating the one or more thicknesses of precursor materials at a temperature above 400° C. to form a film of photovoltaic absorber surrounded by the first trench substantially free from peeling off the conductor material;

8. Stop.

The above sequence of processes provides a method of forming thin-film photovoltaic absorber material on a soda lime glass substrate substantially free from any film peeling problem initiated from peripheral edge region according to an embodiment of the present invention. In a specific embodiment, the method includes advantageously utilizing a patterning process to form a first trench into a conductive material in a vicinity of a peripheral edge region. The patterning process is designated for forming a lower electrode in the conductive material configured for a plurality of photovoltaic cells to be formed above. The conductive material in the first trench is removed to provide an extra barrier for preventing excessive amount of sodium species from diffusing from the soda lime glass (by passing through a thinned or discontinuous barrier material in the peripheral edge region) to an interface between the thin-film photovoltaic absorber material and the conductive material to cause film peeling off Further details of the method can be found throughout the present specification and more particularly below.

Figure 2:
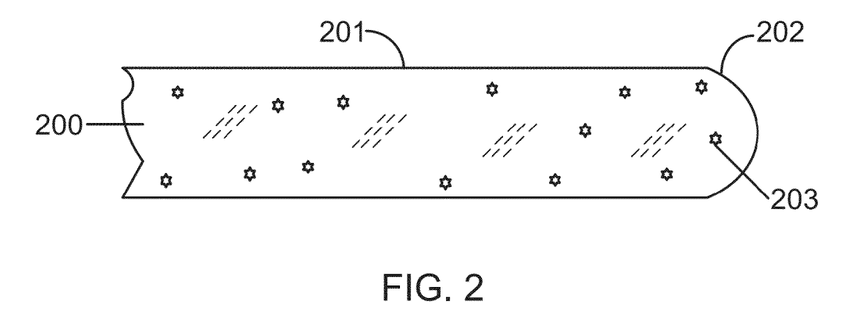
FIGS. 2-11 are simplified diagrams showing a method for manufacturing thin-film photovoltaic devices free of film peeling according to an embodiment of the present invention.

At Step 105, the method 100 starts for the manufacture of a thin-film solar device. Step 110 is them introduced to provide a soda lime glass substrate containing sodium species. The soda lime glass substrate includes a surface region and a peripheral edge region surrounded the surface region. This process is schematically illustrated in FIG. 2. As shown, an enlarged partial section of a substrate 200 includes a portion of surface region 201 connected to an edge region 202. In a specific embodiment, the soda lime glass substrate is a flat glass panel having a rounded peripheral edge region and a rectangular shape with a form factor of about 65 cm×165 cm or greater. Also shown in this sectional view, sodium species 203 existed in the soda lime glass. Typically, the sodium species in the soda lime glass exist as an ionic $Na^+$ phase in molecule of sodium oxide ($Na_2O$). For example, the soda lime glass substrate used in this embodiment contains $Na^+$ within an ingredient of about 14 wt % of $Na_2O$. In another specific embodiment, the rounded peripheral edge region 202 is gradually curved from the flat surface region 201 toward an end tip. In a much reduced scale, not visible in this figure, the curved edge region 202 is made of a plurality of roughened portions including tiny steps or textures. Depending on glass manufacturer's physical specification, the curvature and local roughness can be varied in a certain range. It is noted, the rougher is the edge region, the higher is the possibility to cause incomplete coverage of a thin film formed overlying thereof. To be seen below, an incomplete coverage of a barrier material film provides a much reduced barrier for sodium species 203 to diffuse through those portions and may induce film peeling from the edge region. Embodiments of the present invention just provide a method to eliminate the cause of the edge peeling problem.

Figure 3:
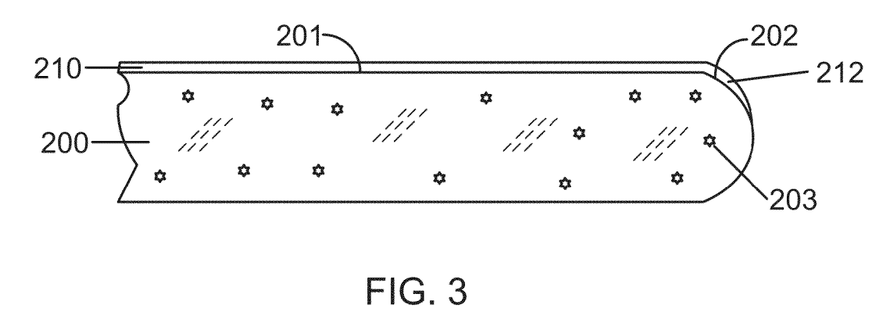

At step 120, a barrier material is formed overlying the soda lime glass substrate. As illustrated in FIG. 3, in a specific embodiment, the barrier material 210 is formed overlying on the surface region 201 with a full coverage as well as overlying the peripheral edge region 202 with a partial coverage. In a specific embodiment, the barrier material 210 is selected from silicon dioxide, silicon nitride, silicon oxynitride, or aluminum-containing silicon oxide to serve as a diffusion barrier. The barrier material 210 can be formed using physical deposition, chemical deposition, sputtering, or other techniques. As shown, due to the curvature and local roughness in the peripheral edge region the deposited barrier material from above may form a film 212 with smaller and smaller thickness from the portion joined with the flat surface region to the end tip. As mentioned earlier, the soda lime glass contains certain concentration of $Na^+$ ions 203. These sodium species 203 can diffuse, especially at elevated temperatures, out of the surface region or the edge region of the glass 200 into a film material overlaid thereof. The barrier material 210 (212) is applied over the substrate to substantially limit these $Na^+$ ions diffusing through, thus establishing a control on the amount of $Na^+$ species from the soda lime glass substrate to a to-be-formed metallic film. However, the reduced thickness and/or incomplete coverage of the barrier material 212 near the peripheral edge region results in an open diffusion path for the sodium species. Because many data show that excessive sodium content in certain metallic films may cause corrosion or other damages to the film structure especially a change in shear stress near an interface region. During a thermal treatment with varied and elevated temperatures, film interface region is likely to lose bonding with a neighboring film, i.e., film peeling can be induced. In our case, the metallic film is essentially one option of a conductor material designated for forming a lower electrode of the thin-film photovoltaic device on the substrate. Experiments have been done to prove that, without some edge treatments, the open diffusion path near the edge region may cause leaking of the excessive sodium ions through the barrier material 212 into the conductive material above to cause edge film peeling off and further diffuse inward to cause larger area film peeling off. Embodiments of the present invention just provide a method for eliminating the cause of the edge film peeling off. More details about controlling the soda lime species directly from soda lime glass into the lower electrode material and absorber material will be found in later sections of the specification.

Figure 4:
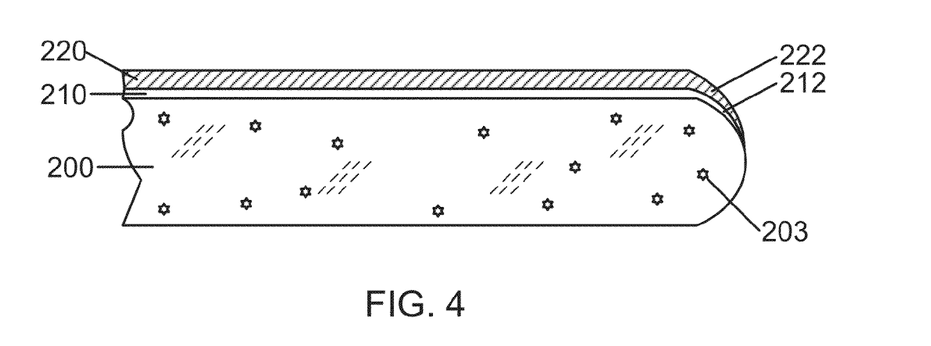

Next process, Process 130, of the method 100 provided in an embodiment of the present invention shown in FIG. 1, includes forming a conductor material overlying the barrier material. The conductor material is intended for forming an electrode (lower electric contact) of a to-be-formed thin-film photovoltaic device. This process is visually illustrated in FIG. 4. As shown, the conductor material 220 is formed as a film with a fairly uniform thickness overlying the barrier material 210. Due to the curvature and roughness of the peripheral edge region 202, the deposited conductor material also forms an edge conductive film 222 with reduced thickness and/or incomplete coverage. In a specific embodiment, the conductor material 220 or 222 comprises one or more layers of molybdenum material, for utilizing its good electrical conductivity, strong bonding with copper-indium based photovoltaic absorber material, as well as its optical properties in visible spectrum. The one or more layers of molybdenum material can be formed using one or more deposition processes. For example, the one or more layers of molybdenum material can be deposited using sputter techniques under different sputtering power and chamber pressure in a vacuum chamber.

Referring to FIG. 1, the method 100 further includes a step 140 for patterning the conductor material to form at least a first trench in a vicinity of a peripheral edge region of the substrate with the conductor material therein substantially removed. In an embodiment, patterning the conductor material 220 is shown schematically in FIG. 5, as one of several patterning processes for forming lower electrode structure for each photovoltaic cell. As shown in the sectional view, multiple trenches 230 are formed partially into the conductor material 220 overlying the barrier material 210 that extends over the whole surface region 201 (FIG. 3). A specific embodiment of the present invention utilizes the patterning process for forming a first trench 231 in a vicinity of a peripheral edge region. The multiple trenches 230 and the first trench 231 can be formed using a mechanical scribing technique or using laser ablation.

Figure 5:
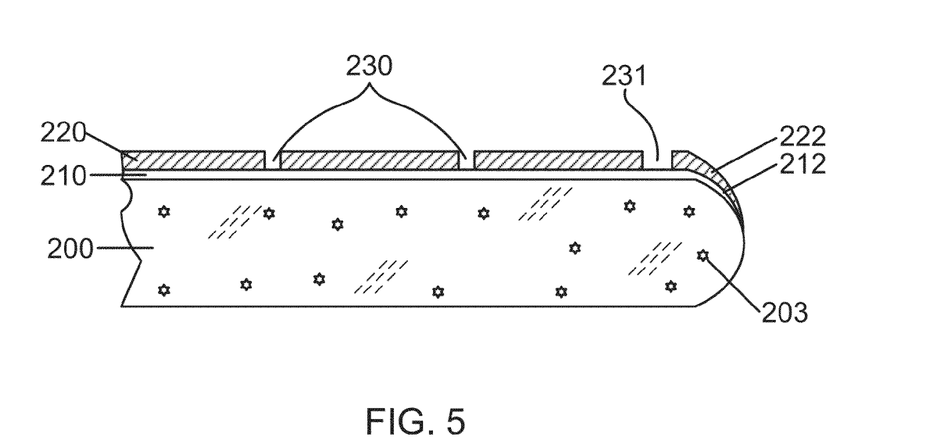

In an embodiment, the laser ablation is used for forming the trenches as a widely-used technique in semiconductor thin-film processing. A laser beam is applied to illuminate the conductor structure to remove the material under the laser spot, forming a line trench by scanning across the surface region. The first trench 231 is a line trench made by illuminating three shifted and overlapped laser spots at one x-coordinate before scanning to next coordinate so that the first trench 231 has a wider width than other trenches 230. By controlling laser illumination time and laser power, the conductor material 220 within the first trench 231 is substantially removed (in fact, the first trench may be made deeper by slightly cutting into the barrier material 210). The first trench as formed thus provides a physical restriction band to separate the surface region that is designated for forming the thin-film photovoltaic devices from the surrounding peripheral edge region. In a specific embodiment, the first trench 231 is formed with about 90 µm in width at about 4 mm away from the glass edge for a soda lime glass substrate with a form factor of 65 cm×165 cm. Of course, there can be other variations, alternatives, and modifications. In alternative embodiments, the trench may have a width of more than or about 90 µm, 100 µm, 250 µm, 500 µm, 750 µm, 1 mm, etc. or more. Alternatively, the width of the trench may be less than or about 90 µm, 80 µm, 70 µm, 50 µm, 25 µm, etc. or less. Additionally, the distance may be less than 4 mm, and can be less than or about 3 mm, 2 mm, 1 mm, etc. or less. In still another alternative, the distance may be more than 4 mm, and may be more than or about 5 mm, 6 mm, 7 mm, 10 mm, etc. or more.

Figure 6:
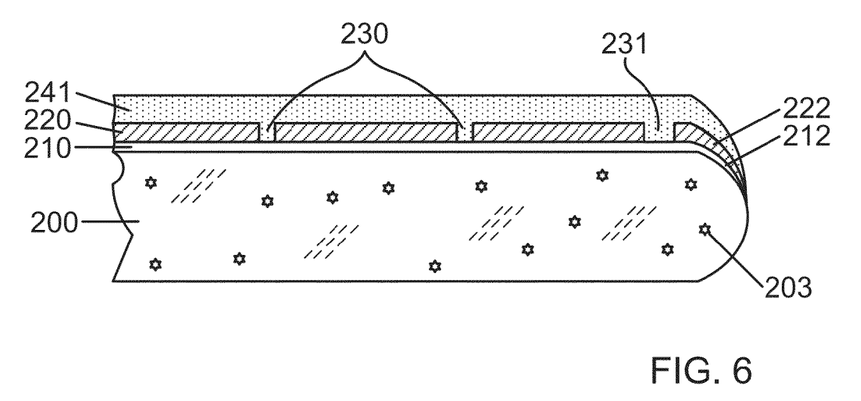

Referring to FIG. 1 again, the method 100 according to the present invention further includes a step 150, for forming one or more thicknesses of precursor materials overlying the patterned conductor material. As illustrated in FIG. 6, a first thickness of a first precursor material 241 is formed overlying the conductor material 220 including filling of the multiple trenches 230. The first precursor material also fills in the first trench 231 and covers the conductor material 222 beyond the first trench 231 in the peripheral edge region with a gradually reduced coverage. In a specific embodiment, the first thickness of the first precursor material is deposited by sputtering a sodium-bearing Cu—Ga target device. The sputter process is performed at near room temperature with DC magnetron sputtering technique. The target device is well selected to have a predominant (>90% wt %) copper-gallium species and mixed with about 8 wt % of $Na_2SeO_3$ species. The sodium bearing target device disposed in the compartment includes a predetermined sodium composition and predominant amount (>90 wt %) of copper-gallium species. Near room temperature deposition suppresses the diffusion of ionic species within the first precursor material and between the film of the first precursor material and the conductor material underneath.

Figure 7:
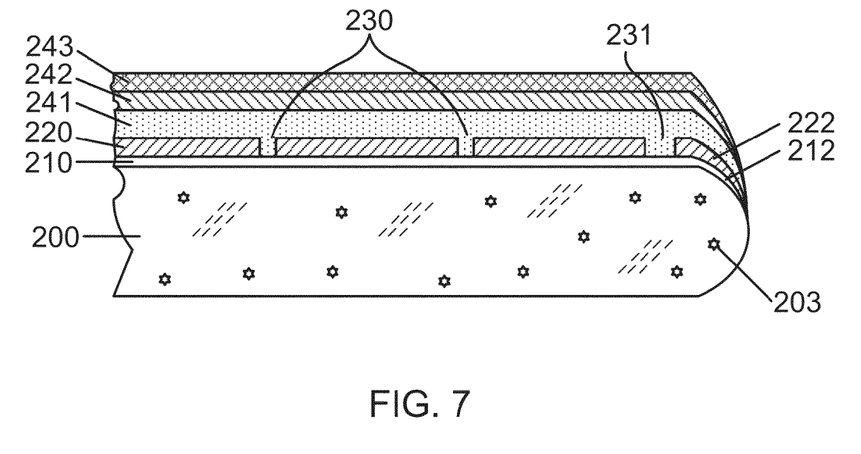

In a specific embodiment, the step 150 includes further forming one or more thicknesses of precursor materials. As illustrated in FIG. 7, a second thickness of the second precursor material 242 is formed overlying the first precursor material 241. In an example, the second precursor material is deposited by sputtering a second target device containing copper-gallium alloy. The deposition is still performed at temperatures near room temperature. Furthermore, a third thickness of the third precursor material 243 is formed overlying the second precursor material 242, by sputtering a third target device containing primarily pure indium species. Of course, the formation of the one or more precursor materials as described above is part of two-stage process for forming a thin-film photovoltaic absorber. The first stage is a low temperature (or near room temperature) deposition of the precursor materials containing copper species, indium species, gallium species, and mixed a proper amount of sodium species (originated from the first target device). The second stage, to be described in a next step with more details, will execute a chemical treatment process to induce a thermal reaction of these precursor materials with one or more reactive gases to transform the precursor material into a multi-grain crystallized compound bearing p-type semiconductor characteristics.

Following the formation of the one or more precursor materials in step 150, the method 100 of the present invention in a specific embodiment includes transferring the glass substrate with the precursor materials formed overlying the conductor material and barrier material into a furnace system. As shown schematically in FIG. 8, the furnace system 300 encloses the soda lime glass substrate 200 as well as the formed films above including a barrier material 210, 212, a conductor material 220, 222, the patterned trench structure 230, 231, and the one or more precursor materials 241, 242, and 243 in a multi-layered structure. In the furnace system 300, the method 100 executes a step 160 for thermally treating the one or more precursor materials in a heated (ramped up from room temperature) environment 320 at temperatures ranging from 400° C. and above to about 550° C. The furnace system 300 is filled with reactive gases 310 including a mixture of selenium species and nitrogen (and hydrogen) species in one embodiment for causing a reactive selenization process to convert the copper, indium, gallium species in the precursor materials into a copper-indium-selenide (CIS) or copper-indium-gallium-selenide (CIGS) compound. In another embodiment, the furnace system 300 is configured to pump out the selenium species and refill sulfur species (mixed with nitrogen or hydrogen species) for causing a sulfurization process to form copper-indium-selenium-sulfide (CISS) or copper-indium-gallium-selenium-sulfide (CIGSS) compound. A certain amount of sodium species existed in the precursor material help to improve the grain quality of CIS/CIGS/CIGSS compound during the thermal treatment at temperatures above 400° C. At the end of the step, the furnace system 300 is cooled down to near room temperature again (with a cooling rate as fast as allowed by the system design and glass transition characteristics), the multi-grain CIS/CIGS/CIGSS compound becomes a film of photovoltaic absorber material 240 (FIG. 9), characterized by its electro-optical properties for converting solar light energy to electrical energy.

Figure 8:
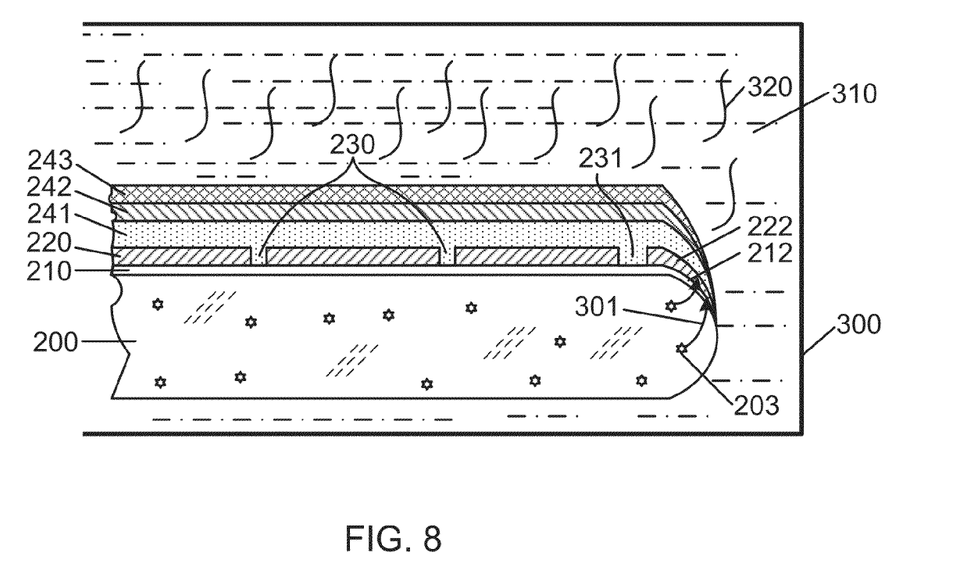

As the step 160 is executed as part of the method 100 for manufacturing a thin-film photovoltaic device on the glass substrate, the same step 160 also induces some side effects especially due to the elevated temperatures and highly reactive chemical environment. Some side effects include sodium species diffusing out of the soda lime glass substrate at the elevated temperatures through one or more pathways. In an embodiment, the soda lime glass substrate 200 has a rounded and roughened edge region 202 that leads to incomplete coverage of barrier material 212 in the edge region 202. The sodium species in the soda lime glass substrate are substantially blocked by the barrier material overlying the surface region 201 but may pass through some thinned barrier material 212 or even bared glass portion in the edge region 202 into the conductor material 222. In other words, as shown in FIG.

Figure 9:
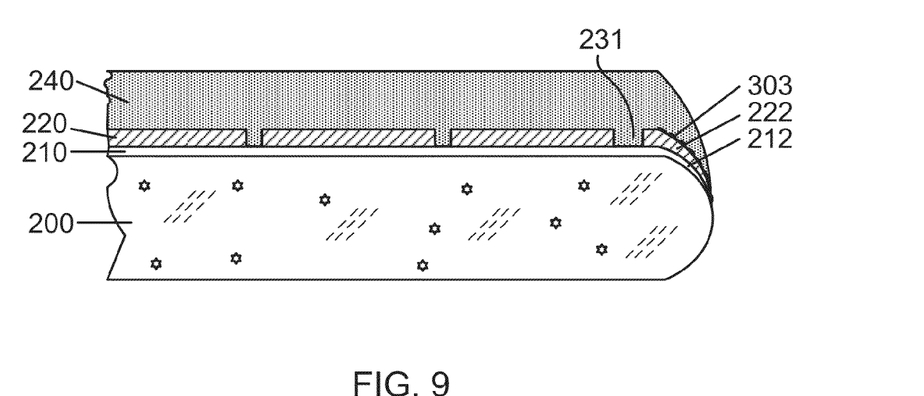
Figure 10:
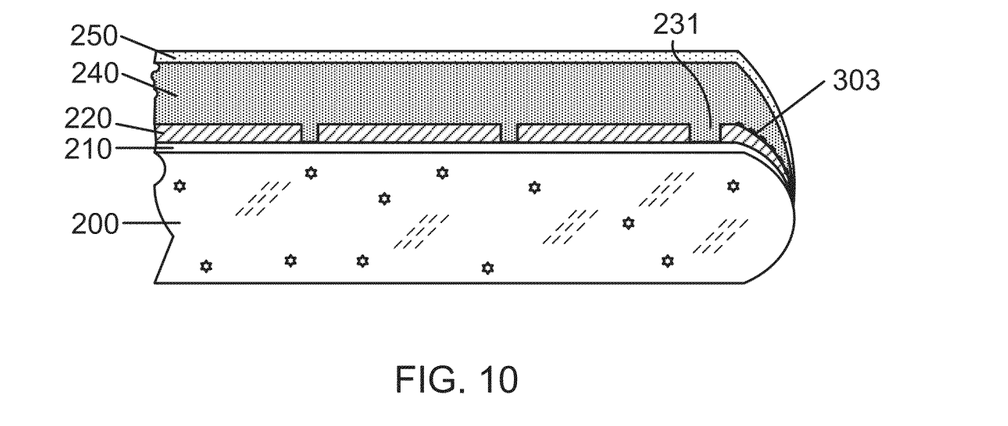

8, the edge region 202 with thinned barrier material 212 or non-covered portion provides an easy pathway 301 for the sodium species to diffuse from the glass substrate to an interface region 303 (FIG. 9). Further the sodium species may build up excessively near the interface region 303 between the conductor material 222 and the film of the photovoltaic absorber 240 and may continue to expand the build up towards the conductor material 220 on the nearby surface region 201. As noted above, excessive sodium species buildup in the interface region may weaken the adhesion of the film on the conductor material 220 and causes the film peeled off when subjecting to large temperature variation. The film peeling starts from the films near the edge region 202 resulting from the excessive sodium species in region 303, and may extend to larger area in the nearby surface region 201. After the thermal treatment process conducted above and additional high temperature vapor deposition process followed the treatment process for forming an upper electrical contact material 250 (as seen in FIG. 10) over the film of the photovoltaic absorber 240, film peeling problem may occur.

In the worst scenario, the film peeling may occur at the inner surface region so that any edge deletion afterward cannot eliminate the problem which causes the module failure. In a specific embodiment of the present invention, the first trench 231 as formed in the step 140 creates a physical barrier for those sodium species through the above pathway in the edge region. It is found that the sodium species diffuse, at the elevated temperatures, with much higher rate in molybdenum material than in copper-gallium alloy material. After the molybdenum material is removed in the step 140 out of the first trench, the first trench is refilled by the copper-gallium alloy in the step 150 (the first precursor material 241), the sodium diffusion is substantially suppressed during the step 160. Therefore, the first trench 231 effective restricts the sodium buildup problem only to the peripheral edge region and prevents the film of the photovoltaic absorber material 240 in the surface region from peeling off the conductor material 220. This is achieved without any other costly edge treatment of the glass substrate before start the manufacture of thin-film photovoltaic devices on the glass substrate according to embodiments of the present invention.

Referring to FIG. 1, the method 100 stops at the step 190, In an alternative embodiment, the first trench 231 continues to serve as a physical barrier for blocking the open sodium diffusion path during one or more additional processes following the thermal treatment step 160. One process, for example, includes a wet process using chemical bath deposition technique to deposit a thin layer (about 10 nm) of aluminum-zinc-oxide (AZO) and/or a buffer layer of cadmium sulfide. The immersion of the soda lime glass substrate (plus all films formed thereon) in an aqueous solution (for the wet process) causes the adhesion failure of the photovoltaic absorber material from the conductor material (Mo), possibly by dissolving a sodium rich interface region. Additionally, as shown in FIG. 10, an upper transparent conductive material 250 is formed overlying (the thin AZO layer and) the photovoltaic absorber material 240. In an embodiment, the upper transparent conductive material 250 is a transparent conductive oxide material made by a chemical vapor deposition, which also is conducted at relative high temperature and chemically reactive environment. For example, the transparent conductive oxide (TCO) material often uses zinc oxide (ZnO). The TCO material of about 2 μm in thickness over the absorber material may cause extra interface stress that further induces film peeling effect at the interface between the absorber and conductor where the adhesion failure occurs due to the existence of sodium species leaked from the glass substrate. In certain embodiments, as sodium species builds up in the edge region 303 between the film of the photovoltaic absorber material 240 and the conductive material (Mo) 222 in the edge region, the chemically active agent in gas phase environment may cause reaction with the active $Na^+$ ions there. This will further weaken the atomic bonding in local film structure and weakens the film adhesion. Therefore, having the first trench 231 formed as a protection barrier surrounding the surface region, any above film structure damages in the peripheral edge region can be disregarded and the film of the photovoltaic absorber material 240 formed in the surface region is substantially free from any peel-off problem.

Figure 11:
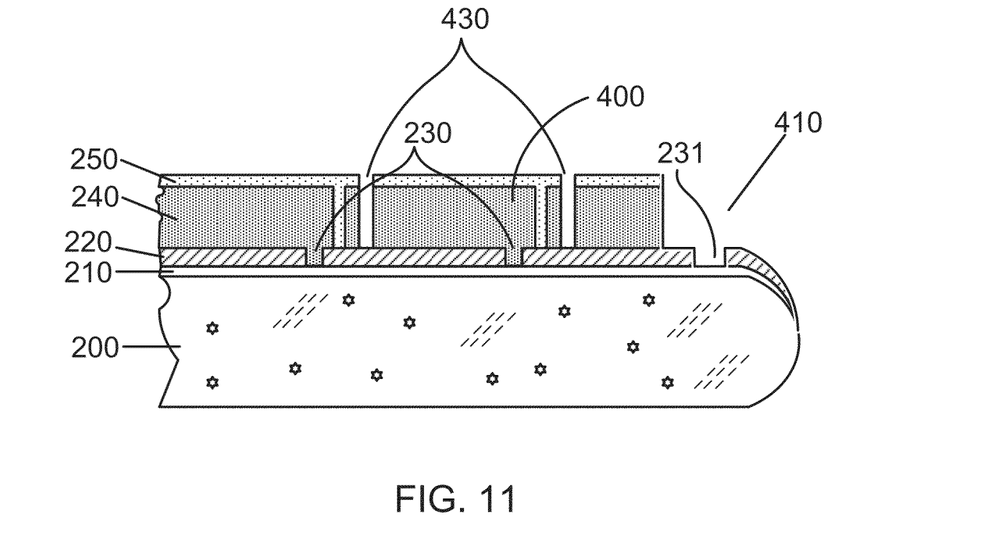

FIG. 11 shows additional steps performed after the upper conductive material formation (FIG. 10) towards a completion of the manufacture of thin-film photovoltaic devices on the substrate. In particular, the additional steps include another patterning process to form the upper electrode structure for a plurality of thin-film photovoltaic cells within the surface region (under the protection of the first trench 231). The present patterning process causes a formation of multiple trenches 430 (and filled with conductor or insulator material) which are correlated to multiple line trenches 230 formed during the patterning process in step 140. The combination of these correlated pattern 430 and 230 results in a formation of a plurality of cells 400 mutually coupled electrically. In another embodiment, the additional steps include an edge deletion process after the formation of all the cell structures 400 to remove most film materials except the lower conductor material in an enlarged edge region including the area around the first trench 231. As seen in FIG. 11, this process creates a region for forming electrical coupling band between cells and external electrode leads. In a specific embodiment, the enlarged edge region has a width up to 15 mm measured from the glass edge. The same process also eliminates the peeled film material within the peripheral edge region. However, the edge deletion process cannot completely eliminate the film peeling problem as the damages created in earlier processes may have extended to surface region greater than the edge deletion width, e.g., the 15 mm. Of course, there are many variations, alternatives, and modifications.

Figure 12:
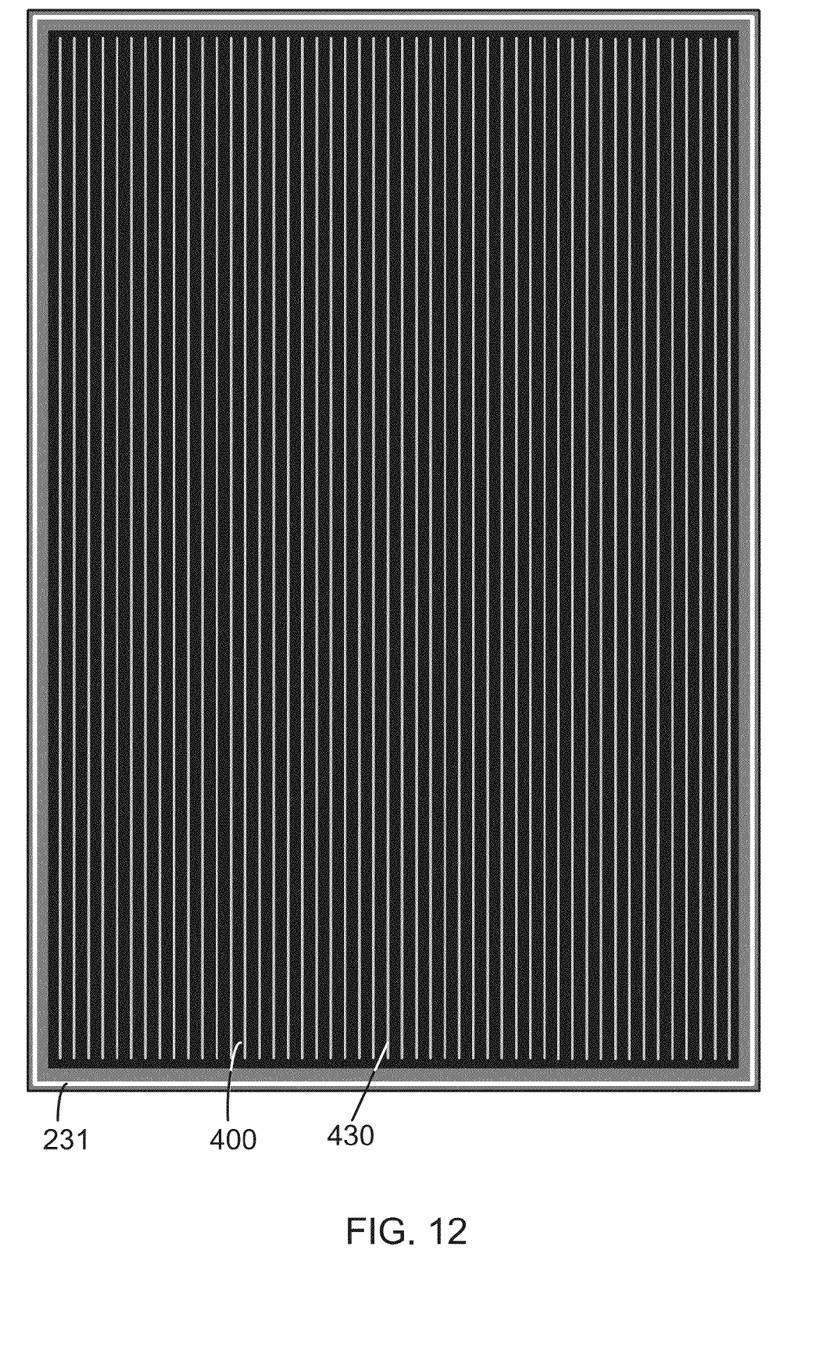
FIG. 12 is a simplified diagram showing a top view of a thin film with stripe patterned structure on a substrate with and a trench formed in a vicinity of peripheral edge region according to an embodiment of the present invention.

FIG. 12 is a simplified diagram showing a top view of a thin film with stripe patterned structure on a substrate with and a trench formed in a vicinity of peripheral edge region according to an embodiment of the present invention. This diagram is merely an example, which should not unduly limit the scope of the claims herein. One of ordinary skill in the art would recognize many variations, alternatives, and modifications. In this top view, a whole area of a thin-film photovoltaic module formed on a rectangular shaped glass substrate with a form factor of 65 cm×165 cm is presented. Each stripe region 400 seen in FIG. 12 represents one of the plurality of photovoltaic cells separated by a line pattern 430 formed after the patterning process described in FIG. 11. The first trench 231 is also seen located around the peripheral edge region.

Figure 13:
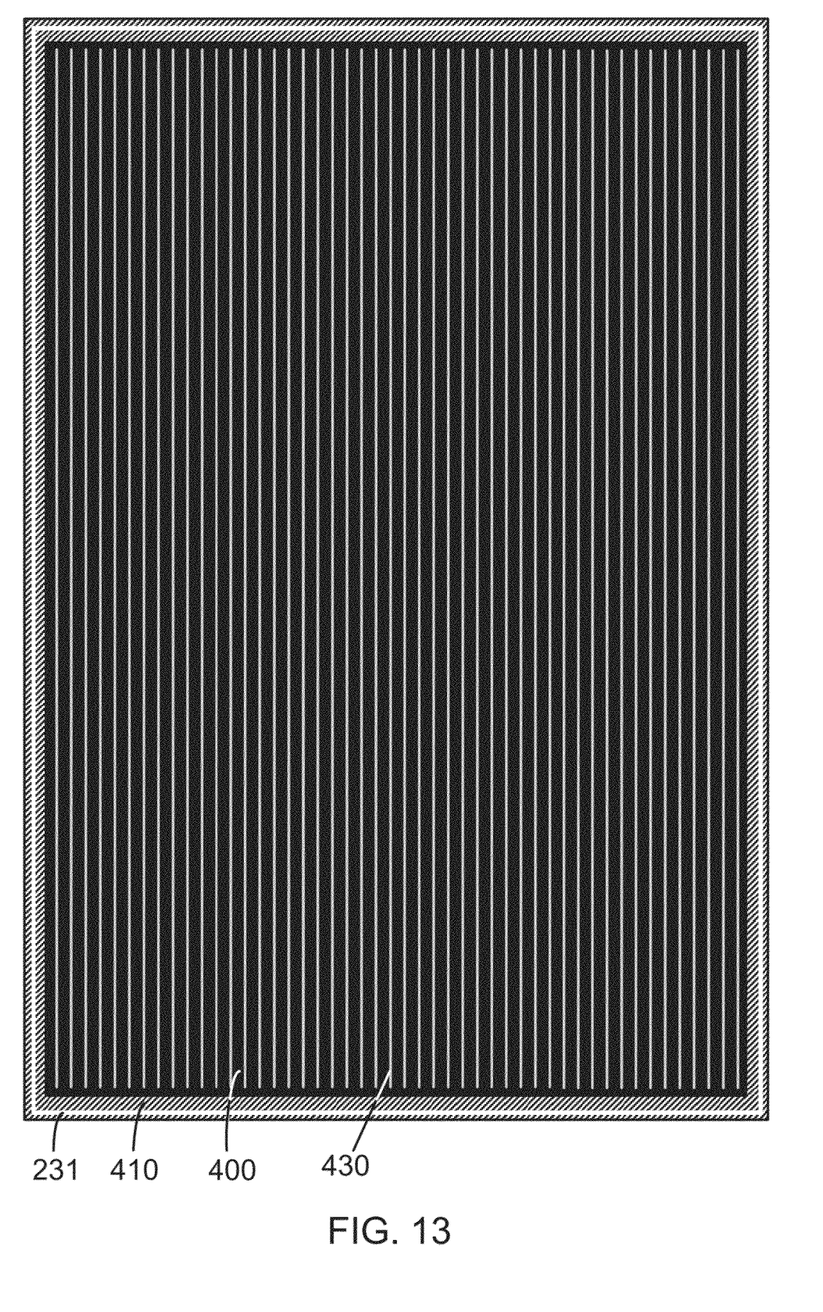
FIG. 13 is a simplified diagram showing a top view of a thin film with stripe patterned structure on a substrate with edge-region film material deleted according to an embodiment of the present invention.

FIG. 13 is a simplified diagram showing a top view of a thin film with stripe patterned structure on a substrate with edge-region film material deleted according to an embodiment of the present invention. This diagram is merely an example, which should not unduly limit the scope of the claims herein. One of ordinary skill in the art would recognize many variations, alternatives, and modifications. The thin-film photovoltaic module shown in FIG. 12 is subjected to an edge deletion process as described in FIG. 11. In this top view, an edge region 410 with an enlarged width (including the first trench 231 and beyond) is carried a laser ablation treatment or a mechanical scrap process to remove most absorber material and upper conductive material. For the glass substrate with a form factor of 65 cm×165 cm, the enlarged width can be up to 15 mm. This region will be further processed to incorporate cell's electric contact and external leads. Further in a specific embodiment, the module will be laminated with a top glass panel with mask tape being applied on the electrical contact and the edge region being sealed with an edge-seal material, followed by assembling with a frame structure.

It is also understood that the examples, figures, and embodiments described herein are for illustrative purposes only and that various modifications or changes in light thereof will be suggested to persons skilled in the art and are to be included within the spirit and purview of this application and scope of the appended claims. Further details of the method for manufacturing a thin-film solar module substantially free of any film peeling can be found throughout the present specification.

What is claimed is:

1. A method for manufacturing a thin-film photovoltaic device free of film peeling problem, the method comprising:
    providing a soda lime glass substrate contained sodium species, the soda lime glass substrate comprising a surface region and a peripheral edge region that extends to an external edge of the substrate;
    forming a barrier material overlying the surface region and at least partially overlying the peripheral edge region;
    forming a conductor material overlying the barrier material so that the conductor material also at least partially overlies the peripheral edge region;
    patterning the conductor material to form a plurality of trenches partially into the conductor material, the plurality of trenches including a first trench in the peripheral edge region with the conductor material therein substantially removed, wherein the first trench is characterized by a width that is greater than a width of each other trench of the plurality of trenches, and wherein the first trench does not completely penetrate the barrier material;
    forming one or more thicknesses of precursor materials overlying the patterned conductor material; and
    treating the one or more thicknesses of precursor materials at temperatures above 400° C. in an environment containing reactive gaseous species to induce a transformation of the one or more thicknesses of precursor materials into a film of photovoltaic absorber, wherein the first trench is configured to surround the surface region for substantially preventing the film of photovoltaic absorber on the surface region from peeling off the conductor material.

2. The method of claim 1 wherein the soda lime glass substrate is a glass substrate having a rounded peripheral edge region and a rectangular shape with a form factor of about 65 cm×165 cm or greater.

3. The method of claim 2 wherein the forming the barrier material comprises depositing a film of silicon oxide, or silicon nitride, or silicon oxynitride, or aluminum-containing silicon oxide with a substantially full coverage over the surface region while a partial coverage over the roughened peripheral edge region.

4. The method of claim 1 wherein forming the conductor material comprises sputtering a thickness of molybdenum material overlying the barrier material.

5. The method of claim 1 wherein the patterning the conductor material comprises performing laser ablation to form the plurality of trenches in the conductor material on the surface region with the conductor material therein being partially removed.

6. The method of claim 5 wherein the first trench in the vicinity of the peripheral edge region comprises a width of about 90µm and greater formed by illuminating a laser beam to two or more overlapped spots to vaporize an amount of the conductor material under the spot.

7. The method of claim 6 wherein the first trench forms a closed-loop located about 4 mm or smaller away from the peripheral edge region.

8. The method of claim 1 wherein the forming one or more thicknesses of precursor materials comprises:
    sputtering a first target device containing copper species and gallium species doped with sodium species to form a first thickness of a first precursor material overlying the patterned conductor material including the first trench;
    sputtering a second target device containing copper gallium species to form a second thickness of a second precursor material overlying the first precursor material; and
    sputtering a third target device containing indium species to form a third thickness of a third precursor material overlying the second precursor material.

9. The method of claim 8 wherein each sputtering is performed at a temperature ranging from room temperature to less than 100° C.

10. The method of claim 8 wherein the treating the one or more thicknesses of precursor materials at temperatures above 400° C. comprises causing the copper species, gallium species, and indium species to react with gaseous selenium species and sulfur species under an assistant of the doped sodium species to form the film of photovoltaic absorber.

11. The method of claim 10 wherein the first trench comprises a physical barrier to block the sodium species in the soda lime glass substrate from diffusing via the peripheral edge region into the conductor material on the surface region.

12. The method of claim 10 wherein the film of photovoltaic absorber overlying the conductor material comprises copper indium selenide (CIS) compound, copper indium gallium selenide (CIGS) compound, copper indium gallium selenium sulfide (CIGSS) compound.

13. The method of claim 1 further comprising forming a transparent conductive oxide material overlying the film of the photovoltaic absorber and performing edge deletion using laser ablation to remove all film materials above the conductor material from the peripheral edge region up to a width of about 15 mm toward the surface region, the film of the photovoltaic absorber on the surface region being substantially free from peeling off the conductor material.

* * * * *